(12) United States Patent
Friis et al.

(10) Patent No.: US 6,987,068 B2
(45) Date of Patent: Jan. 17, 2006

(54) METHODS TO PLANARIZE SEMICONDUCTOR DEVICE AND PASSIVATION LAYER

(75) Inventors: Peter Friis, Ishoei (DK); Jesper Hanberg, Soborg (DK)

(73) Assignee: Intel Corporation, Santa Clara, CA (US)

( * ) Notice: Subject to any disclaimer, the term of this patent is extended or adjusted under 35 U.S.C. 154(b) by 29 days.

(21) Appl. No.: 10/460,878

(22) Filed: Jun. 14, 2003

(65) Prior Publication Data
US 2004/0253829 A1 Dec. 16, 2004

(51) Int. Cl.
*H01L 21/302* (2006.01)

(52) U.S. Cl. .......................... 438/739; 438/738
(58) Field of Classification Search ......... 438/735–739
See application file for complete search history.

(56) References Cited

U.S. PATENT DOCUMENTS

| | | | |
|---|---|---|---|
| 4,356,056 A | 10/1982 | Cornette et al. | |
| 5,286,665 A * | 2/1994 | Muragishi et al. | 438/257 |
| 5,472,564 A * | 12/1995 | Nakamura et al. | 216/51 |
| 5,895,273 A * | 4/1999 | Burns et al. | 438/719 |
| 6,004,853 A * | 12/1999 | Yang et al. | 438/305 |
| 6,077,789 A * | 6/2000 | Huang | 438/720 |
| 6,235,638 B1 * | 5/2001 | Huang et al. | 438/695 |
| 6,399,469 B1 * | 6/2002 | Yu | 438/595 |
| 6,528,363 B2 * | 3/2003 | Ku et al. | 438/197 |
| 6,541,320 B2 * | 4/2003 | Brown et al. | 438/197 |
| 6,583,469 B1 * | 6/2003 | Fried et al. | 257/329 |
| 6,593,243 B1 * | 7/2003 | Kimura | 438/706 |
| 6,767,835 B1 * | 7/2004 | Nariman et al. | 438/710 |
| 6,812,119 B1 * | 11/2004 | Ahmed et al. | 438/585 |

FOREIGN PATENT DOCUMENTS

| | | |
|---|---|---|
| GB | 2352874 | 7/2001 |
| JP | 60235436 | 11/1985 |
| JP | 06021432 | 1/2004 |

* cited by examiner

*Primary Examiner*—Christian Wilson
(74) *Attorney, Agent, or Firm*—Schwabe, Williamson & Wyatt, P.C.

(57) ABSTRACT

Embodiments of methods in accordance with the present invention provide a planarized surface between a semiconductor device and a portion of surrounding passivation material. The methods involve the use of a hard mask that defines the planarized surface as the interface between the hard mask and both the passivation layer and the device, after a passivation layer etching process. The resulting planarized surface has a small to zero step height, is insensitive to passivation layer non-uniformity and etch non-uniformity, provides full passivation of the device side wall, provides protection for the device against etch-induced damage, and prevents the detrimental effects of passivation layer voids. The methods are applicable to semiconductor device fabrication for electronic and photonic systems such as, but not limited to, cell phones, networking systems, high brightness (HB) light emitting diodes (LEDs), laser diodes (LDs), and multijunction solar cells.

29 Claims, 9 Drawing Sheets

METHODS TO PLANARIZE SEMICONDUCTOR DEVICE AND PASSIVATION LAYER

FIELD OF THE INVENTION

The present invention relates to semiconductor device fabrication and, more particularly, to fabrication methods involving the passivation of devices and planarization of passivation and device material layers.

BACKGROUND OF THE INVENTION

Semiconductor components, such as components for optoelectronic applications, frequently use layered heterostructures of semiconductor materials (e.g. PIN junction or multi-quantum wells) where semiconductor devices are mostly built from layer upon layer in the vertical direction on a substrate. The layers are selectively deposited and selectively removed using various deposition and material removing processes. These layers can be on the order of nanometers to micrometers in thickness. The methods are used to create microelectronic semiconductor devices, such as diodes and transistors, on the substrate.

In the course of semiconductor fabrication, some processing steps leave a device with an exposed device side wall. These side walls form conductive oxide layers in some material systems, such as, but not limited to, InP and InGaAsP. The side wall is subsequently passivated so that no leakage current will exist between individual material layers forming the semiconductor device, and/or between the layer above to the layer below the semiconductor device. Commonly, passivation is achieved by the application of a passivation material, such as, but not limited to, BCB polymer and PMMA photoresist, that is spun around and over the device to encapsulate the side wall.

After the passivation layer is formed, the surface of the passivation layer is planarized with the top of the device. Planarizing is required, for example, such that a high definition metallization layer may be formed across the surface to effect electrical interconnection with other devices or components.

One method of planarization is by use of a chemical etching process that etches the surface of the passivation layer to an elevation from the substrate substantially the same as the top surface of the device; a process known as etch-back. Planarization using a chemical etching process is not without complications. FIG. 20 is a cross-sectional view showing a conforming passivation layer 86 encasing a multi-layer semiconductor device 82. The passivation layer 86 conforms to the device side wall 83. FIG. 21 is a cross-sectional view showing the passivation layer 86 after an etching process was used to lower the passivation layer surface 89 to substantially the same elevation as the device surface 87.

A common problem with the etching of a surface containing two materials is known as trenching. Trenching is found at the interface of the two materials where enhanced etching can occur. The enhanced etching at the material interface forms a trench 88, as shown in FIG. 21. The trench 88 can extend from the passivation layer surface 89 to the next material layer or to the substrate 80 adjacent the device side wall 83. This trenching can, in some cases, allow the exposed device side wall 83 to form a conductive oxide layer. Subsequent formation of a metallization layer on the device surface 87 and the passivation layer surface 89 can result in the unpassivated device side wall 83 being coated with the metallization material causing an interlayer electrical short.

The transition between the passivation layer surface 89 and the device surface 87 must be within an acceptable step height 90. In many cases, the acceptable step height 90 is defined, for a multi-layer semiconductor device 82, to be somewhat smaller than the thickness of the top layer defining the device surface 87 in order to prevent shorting between the adjacent device layer.

In some instances, the passivation layer 86 will contain micro defects (not shown), such as gas bubbles or voids. As the passivation layer 86 is etched back, any exposed voids will grow, possibly extending from the passivation layer surface 89 to the device side wall 83. This can also cause interlayer electrical shorting.

In some instances, a residue layer 84 of passivation material remains on the device surface 87 after the etching of the passivation layer 86. This residue layer 84 can remain for a number of reasons, such as, but not limited to, particle contamination masking the removal of the passivation layer 86, and carbonized passivation material caused by etching processes that is resistant to etch removal, among others. This residue layer 84 is detrimental to the quality of the interconnection between the device surface 87 and other devices.

New methods are needed for the fabrication of semiconductor devices and components that provide for non-mechanical planarization of the passivation layer and the exposed surface of the devices without the trenching phenomenon associated with etching technologies. The methods would preferably provide a small to zero step height between different materials on the surface, be relatively insensitive to passivation layer non-uniformity and etch non-uniformity, provide acceptable passivation of the device side wall with little to no possibility of trenching, provide protection for the device against etch-induced damage, ensure a residue-free device surface, and/or prevent the detrimental effects of passivation layer voids. The methods preferably also have a low defect rate, impart little to no harm to the underlying desired material layers, and/or be reasonably economical.

DESCRIPTION

Figure 1:
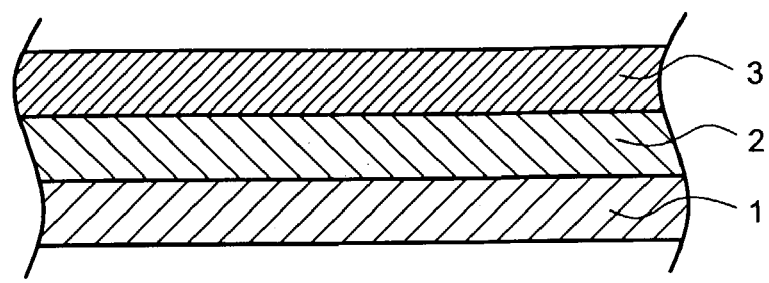
FIG. 1 is a cross-sectional view of a substrate, a conformal device layer, and a conformal hard mask layer, in accordance with an embodiment of the method of the present invention.

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

The following embodiments, in accordance with the methods of the present invention, are described as applied to the fabrication of compound semiconductor devices. This is but one example of a class of devices that can benefit from the present invention. The present invention is suitable for a wide variety of material processing, including, but not limited to, Indium Phosphide and other compound semiconductor-based materials, and silicon, and is not to be limited by the included examples. The present invention is particularly useful where a quasi-planarized multi-material surface is required.

In the following description, the term "device" is used to identify the discrete layer or layers of material that is or will be surrounded by passivation material. The device, individually and in combination, can take many forms, such as, but not limited to, diode, transistor, and FET, including electronic and optoelectronic devices. The embodiments of the present invention may be practiced for many applications requiring planarization between two or more materials, and therefore, the present invention is not to be limited to the devices and/or materials described by way of example.

Compound semiconductor-based devices are used in a wide variety of electronic and photonic systems. Various elements are combined to become compound semiconductors. The most common elemental combinations come from the Group III and Group V elements, although II–VIs and some from the Group IVs are also considered. These combinations include Gallium (Ga) and Arsenic (As) to form Gallium Arsenide (GaAs), Indium (In) and Phosphorus (P) to form Indium Phosphide (InP), Silicon (Si) and Carbon (C) to form Silicon Carbide (SiC), and Gallium and Nitrogen to form Gallium Nitride (GaN). Often, more than two elements are combined, such as with Aluminum (Al) to form alloys including AlGaP and AlGaN, as well as InGaAsP and InGaAsN.

Whether silicon or compound semiconductors, the substrate, also known as a wafer, is typically sliced and polished to form the thin starting substrate upon which the ultimate electronic or photonic devices are fabricated.

FIGS. 1 through 16 illustrate side cross-sectional views of the result at various stages of the fabrication of a semiconductor device using mask and etch techniques in accordance with embodiments of the methods of the present invention. The mask and etch techniques are shown by way of example and are not limited thereto, as other technologies may be used to fabricate the semiconductor devices with similar features and characteristics. The figures illustrate idealized structures having straight edges and sharp corners. It is understood and appreciated that the resulting structures formed using embodiments of methods of the present invention, and in particular those structures formed using etching processes, will deviate from the idealized illustrations in ways, such as, but not limited to, non-straight edges and rounded corners.

In the following description, embodiments of the present invention are shown by way of example as one semiconductor device formed on a substrate, but the embodiments are not limited thereto. It is understood that in many applications, a plurality of devices, such as, but not limited to, a quantity numbering in the one-hundred thousands and more, each having a surface at substantially the same elevation from the substrate are formed on the same substrate. In many cases, planarization is required in order to electrically interconnect the plurality of devices utilizing a network of conductive traces formed on a common plane. One semiconductor device is shown in the figures simply to more clearly describe the elements of the invention.

FIGS. 1 through 16 illustrate side cross-sectional views of the result at various stages of the fabrication of a semiconductor device in accordance with embodiments of the methods of the present invention.

FIG. 1 is a cross-sectional view of a substrate 1, a conformal device layer 2, and a conformal hard mask layer 3 thereon. The device layer 2 comprises semiconductor material that will form the desired semiconductor device. The device layer 2 may be a single layer of one material, such as, but not limited to, InP, or comprise multiple material layers, such as, but not limited to, InP/ InGaAsP multi-quantum wells/InP. The hard mask layer 3 is a material that has predetermined etching characteristics resistant to the etching processes used to define the device layer and remove the passivation layer as described below. The hard mask layer 3 comprises a material, such as, but not limited to, silicon dioxide (SiO2), silicon nitride (Si3N4), and metals.

Figure 2:
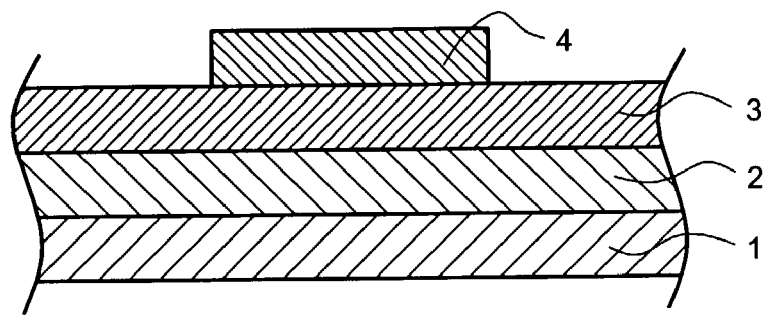
FIG. 2 is a cross-sectional view of a resist mask formed upon the hard mask layer, in accordance with an embodiment of the method of the present invention.

FIG. 2 is a cross-sectional view of a resist mask 4 formed upon the hard mask layer 3. The method in which the resist mask 4 is formed is well known using methods, such as, but not limited to, photolithographic techniques.

Figure 3:
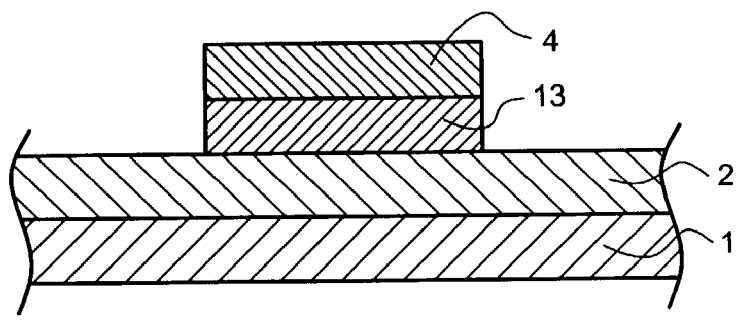
FIG. 3 is a cross-sectional view showing the hard mask layer and the resist mask after an etching process, in accordance with an embodiment of the method of the present invention.

FIG. 3 is a cross-sectional view showing the hard mask layer 3 and the resist mask 4 after an appropriate etching process. The resist mask 4 is used to pattern the hard mask layer 3 to define an exposed hard mask layer. The etching process removes the exposed hard mask layer 3 that is not protected by the resist mask 4 to define a hard mask 13 and exposed underlying device layer 2. Suitable etching processes, by way of example and not limited thereto, wherein the hard mask layer comprises SiO2, includes a wet etching process using buffered hydrofluoric acid (BHF) and a plasma etching process using C2F6+CHF3+O2, among others.

Figure 4:
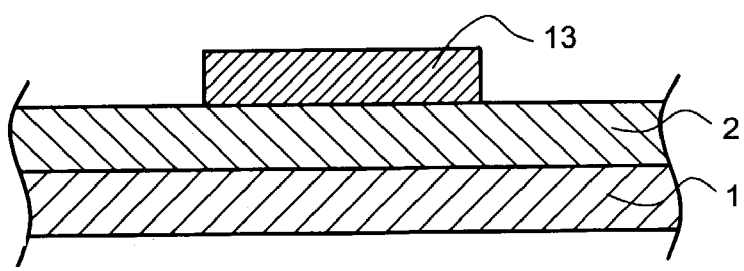
FIG. 4 is a cross-sectional view showing the hard mask after a cleaning process that removed the resist mask, in accordance with an embodiment of the method of the present invention.

FIG. 4 is a cross-sectional -view showing the hard mask 13 after an appropriate cleaning process, such as, but not limited to acetone wash, which removes the resist mask 4. The hard mask 13 is exposed and used to define a predetermined exposed portion of the underlying device layer 2.

Figure 5:
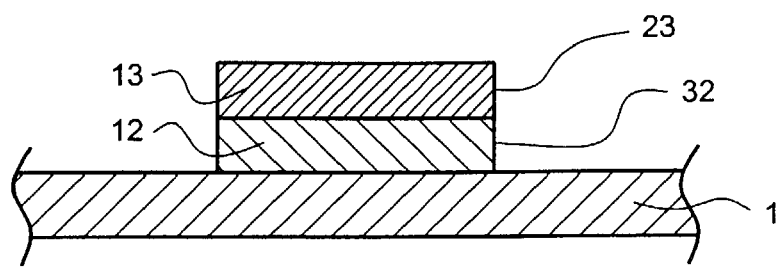
FIG. 5 is a cross-sectional view showing the hard mask and a defined device layer after an etching process that removed portions of the device layer, in accordance with an embodiment of the method of the present invention.

FIG. 5 is a cross-sectional view showing the hard mask 13 and a defined device layer 12 after an appropriate etching process. The hard mask 13 comprises a material resistant to the etching process used to etch the exposed device layer 12 to effectively protect the underlying portion of the device layer 12. The etching process removes exposed portions of the device layer 2 not protected by the hard mask 13. Corresponding portions of the underlying substrate 1 are therefore exposed. An appropriate etching process includes, but is not limited to, an appropriate plasma etching process, also known as dry etching. An appropriate plasma etching process includes, but is not limited to, the well-known CH4+H2+O2 process. Plasma etching is particularly useful for high-resolution material removal to selectively etch only the device layer 2 that is not in the shadow of the hard mask 13. The result is a defined device layer 12 having a well defined device side wall 32 that is substantially coplanar with a hard mask side wall 23.

Figure 6:
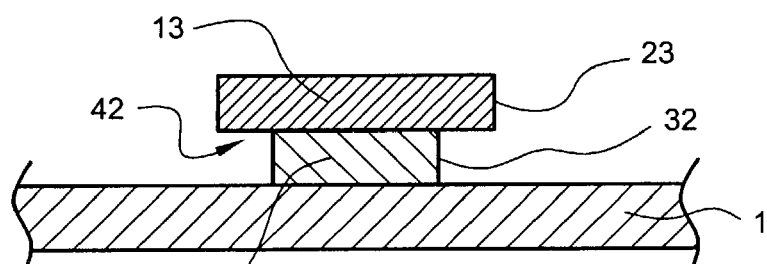
FIG. 6 is a cross-sectional view showing a semiconductor device resulting from selectively wet etching the device side wall, in accordance with an embodiment of the method of the present invention.

FIG. 6 is a cross-sectional view showing a semiconductor device 22 formed by etching the device side wall 32. An appropriate wet etching process is used to remove device material underlying the perimeter of the hard mask 13 to form a step interface 42 between the hard mask 13 and the semiconductor device 22. Wherein the semiconductor device 22 comprises a compound semiconductor, such as, but not limited to InP, an appropriate wet etching solution includes, but is not limited to, hydrochloric acid (HCl, HCl+H3PO4). The step interface 42 defines a mask overhang or undercut of, for example, but not limited thereto, approximately a few micrometers in width that shadows a portion of the substrate 1 below and about the device side wall 32.

Other embodiments in accordance with the methods of the present invention incorporate a wet etching process rather than plasma etching for producing the defined device layer 12 shown in FIG. 5. A wet etching process is used to remove portions of the device layer 2 from the substrate 1 not protected by the hard mask 13, as well as a portion of the device layer 2 below the perimeter of the hard mask 13, as shown in FIG. 6, defining a device side wall 32 and a step interface 42.

Figure 7:
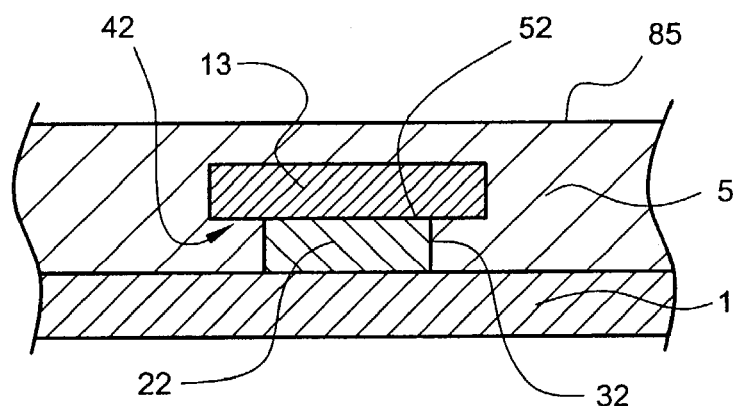
FIG. 7 is a cross-sectional view showing a conforming passivation layer extending to at least above the device surface, in accordance with an embodiment of the method of the present invention.

FIG. 7 is a cross-sectional view showing a conforming passivation layer 5 applied to the substrate 1. The passivation layer 5 is applied to encase the semiconductor device 22. An applied passivation layer surface 85 extends to a predetermined elevation from the substrate 1 that is at least above the elevation of the device surface 52. The passivation layer 5 conforms to the step interface 42 and the region immediately between the hard mask 13 and the substrate 1. The passivation layer 5 is preselected from materials with appropriate electrical properties and etching characteristics. A suitable material for the passivation layer 5 includes, but is not limited to, Bisbenzocyclotene (BCB) polymer. In one application technique, among others, the passivation material is spun onto the substrate 1 to penetrate under and conform to the step interface 42, thus sealing and passivating the device side wall 32 of the -semiconductor device 22.

Figure 8:
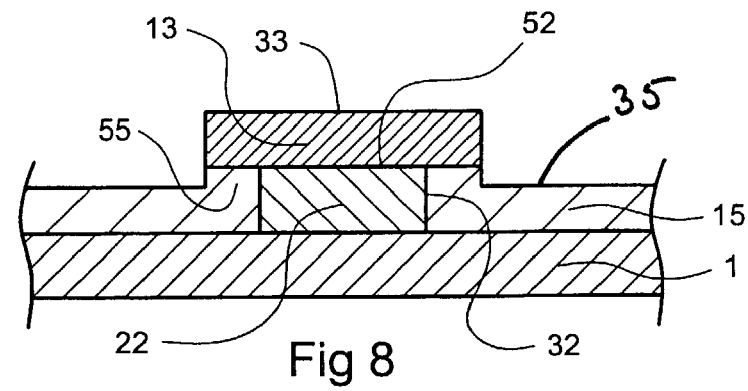
FIG. 8 is a cross-sectional view showing a passivation layer after an etching process, in accordance with an embodiment of the method of the present invention.

FIG. 8 is a cross-sectional view showing a passivation layer 15 after a suitable etching process. The etching process produces a passivation layer surface 35 that is at a lower elevation, from the substrate 1, than the hard mask 13, at an elevation between the hard mask 13 and the substrate 1. The hard mask 13 shields the portion of the passivation layer 15 that is defined by the perimeter of the hard mask 13, between the hard mask 13 and the substrate 1, adjacent the device side wall 32, from the etching process to form a passivation liner 55. The hard mask 13 also, in combination with the passivation liner 55, shields the interface between the device side wall 32 and the passivation liner 55 from exposure to the etching process, which reduces or eliminates the possibility of trenching. Any micro-voids that may be present in the passivation liner 55 and adjacent to the device side wall 32 are not exposed to the etching process and therefore, the potential for etched void enlargement to expose the device side wall 32 is greatly reduced or eliminated. Further, the encased semiconductor device 22 is protected from exposure to the etching process reducing or preventing etch-induced damage.

Figure 9:
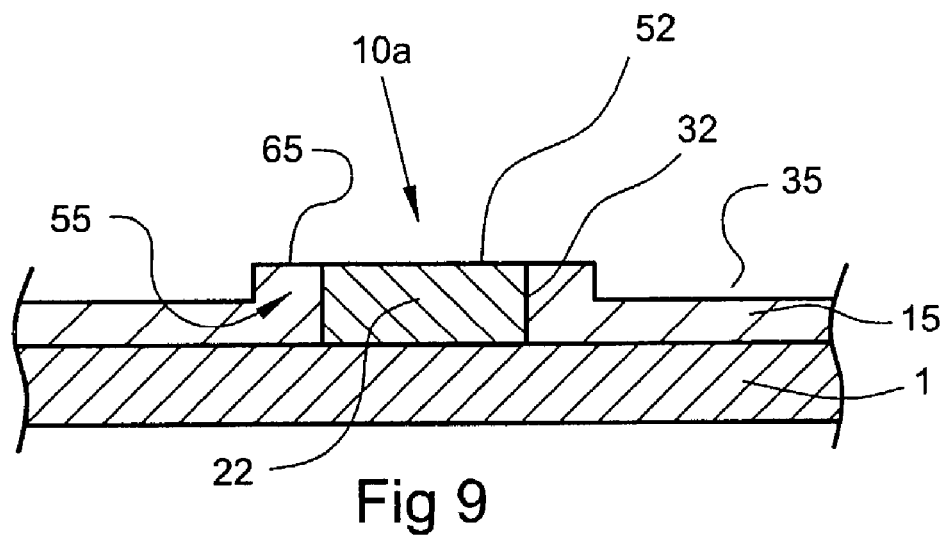
FIG. 9 is a cross-sectional view after the removal of the hard mask in an etching process surface, in accordance with an embodiment of the method of the present invention.

FIG. 9 is a cross-sectional view after the removal of the hard mask 13 which exposes the device surface 52 and a coplanar passivation liner surface 65. The hard mask 13, which originally had conformed to the surface characteristics of the defined device layer 12 prior to the formation of the step interface 42, as shown in FIG. 5, provides a form or mold to which the passivation layer 5 conforms, which imparts a complimentary surface onto the resulting passivation liner surface 65. This provides that the device surface 52 and the passivation liner surface 65 form a planarized surface 10a having a small to zero step height. In this embodiment, the planarized surface 10a extends at a higher elevation from the substrate 1 than the passivation layer surface 35.

The hard mask 13 minimizes the effects of non-uniformity of the passivation layer surface 35 or non-uniformity in the etching process as the planarized surface 10a is defined not by the etching processes, but by the hard mask 13 itself. This allows for a relaxation of processing tolerances and a reduction in defect rate. The hard mask 13 also reduces or eliminates the possibility of residual passivation material remaining on the device surface 52, as it is protected from contact with the passivation material.

The resulting planarized surface 10a is particularly suitable for formation of high resolution material layers, such as, but not limited to, a patterned conductive metallized material layer (not shown) that forms electrical interconnects between the semiconducting devices and other electrical components, such as, but not limited to, semiconducting devices and a power supply node. The passivation layer surface 35 may be used, in addition to the planarized surface 10a, for lower resolution material layers, such as, but not limited to, metallized bond pads (not shown), depending on the elevation between the planarized surface 10a and passivation layer surface 35.

Figure 10:
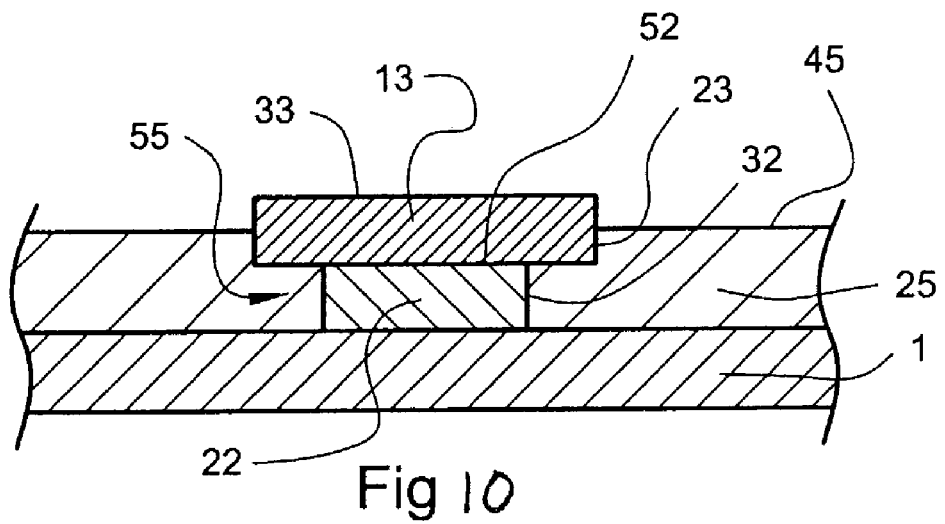
FIG. 10 is a cross-sectional view showing a passivation layer after an etching process, in accordance with an embodiment of the method of the present invention.
Figure 11:
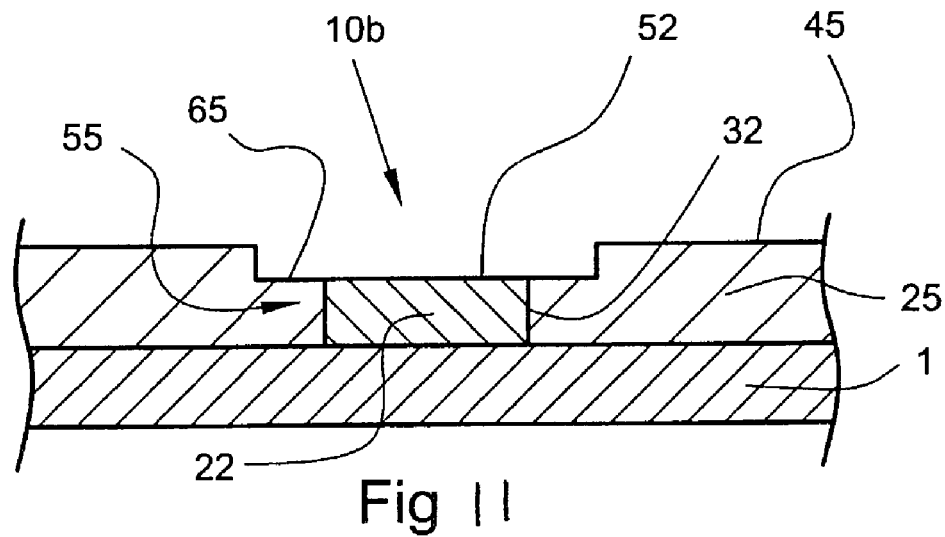
FIG. 11 is a cross-sectional view after the removal of the hard mask that exposes the device surface and a coplanar passivation liner surface, in accordance with an embodiment of the method of the present invention.

FIGS. 10 and 11 illustrate the results of another embodiment in accordance with the methods of the present invention. FIG. 10 is a cross-sectional view showing the etched passivation layer 25 after an etching process used to lower the passivation layer surface 45 of the passivation layer 25 to a lower elevation from the substrate 1 than the hard mask surface 13 and adjacent the hard mask side wall 23.

FIG. 11 is a cross-sectional view after the removal of the hard mask 13 that exposes the device surface 52 and a coplanar passivation liner surface 65. The hard mask 13 shields a portion of the passivation layer 25 that is between the hard mask 13 and the substrate 1 from the etching process to form a passivation liner 55 adjacent the device side wall 32. The device surface 52 and the coplanar passivation liner surface 65 result in a planarized surface 10b that is recessed at a lower elevation from the substrate 1 than the passivation layer surface 45, upon which additional material layers may be formed.

It is appreciated that the elevation from the substrate 1 of the planarized surface 10a,b above the substrate 1 is dependent on the elevation of the semiconductor device 22. It is also be appreciated that the elevation of the passivation layer surface 35,45 can be varied between an elevation that is adjacent the hard mask surface 33 to an elevation defined by the surface of the substrate 1, predetermined for a particular purpose.

Figure 12:
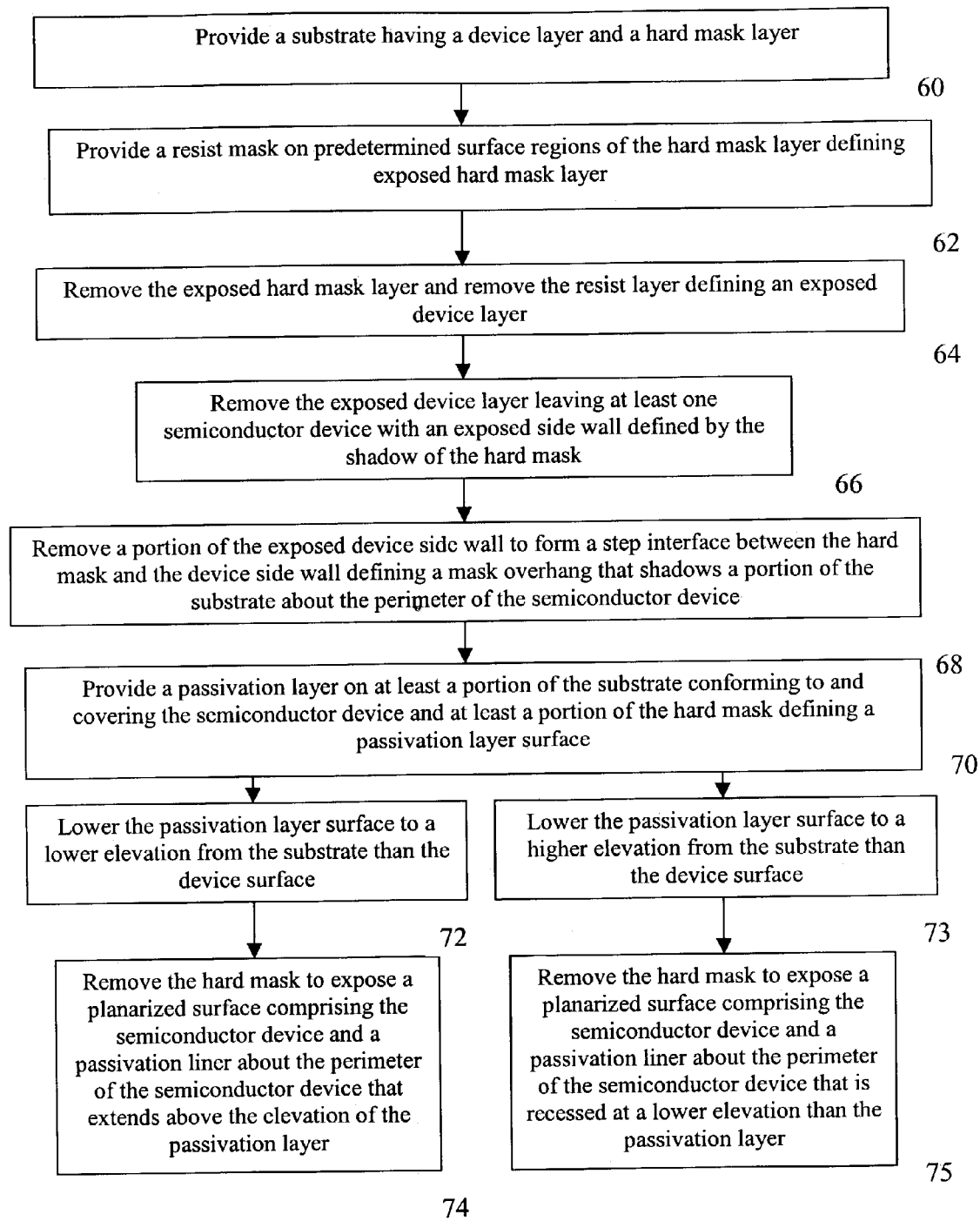
FIG. 12 is a flow chart of selected embodiments of methods in accordance with the present invention.

FIG. 12 is a flow diagram of suitable exemplary methods in accordance with various embodiments. One method in accordance with an embodiment of the invention comprises: providing a substrate having one or more device layers and a hard mask layer 60; providing a resist mask on predetermined surface regions of the hard mask layer defining exposed hard mask layer 62; removing the exposed hard mask layer and removing the resist layer to define a hard mask on the device layer defining an exposed device layer 64; removing the exposed device layer using a suitable process, such as, but not limited to, a dry etching process, leaving at least one semiconductor device with an exposed side wall defined by the shadow of the hard mask 66; removing a portion of the exposed side walls using a suitable process, such as, but not limited to, a wet etch process, to form a step interface between the hard mask and the device side wall forming a mask overhang that shadows a portion of the substrate about the perimeter of the semiconductor device 68; providing a passivation layer on the substrate conforming to and covering the semiconductor device and at least a portion of the hard mask defining a passivation layer surface 70; lowering the passivation layer surface using a suitable process, such as, but not limited to, etching, to a lower elevation from the substrate than the hard mask 72; and removing the hard mask to expose a planarized surface comprising the semiconductor device and a passivation liner about the perimeter of the semiconductor device that extends above the elevation of the passivation layer 74.

Another embodiment in accordance with the methods of the present invention comprises essentially of the same method as provided above, wherein the suitable process includes, but is not limited to, a wet etching process, used to remove the exposed device layer leaving a semiconductor device with an exposed side wall defined by the shadow of the hard mask 66.

Other embodiments in accordance with the methods of the present invention comprise essentially of the same methods as provided by the two methods immediately above, wherein lowering the surface of the passivation layer using a suitable process, such as, but not limited to, etching, to an elevation adjacent the hard mask 73; and removing the hard mask to expose a planarized surface comprising the semiconductor device and a passivation liner about the perimeter of the semiconductor device that is recessed at a lower elevation than the passivation layer 75.

Figure 13:
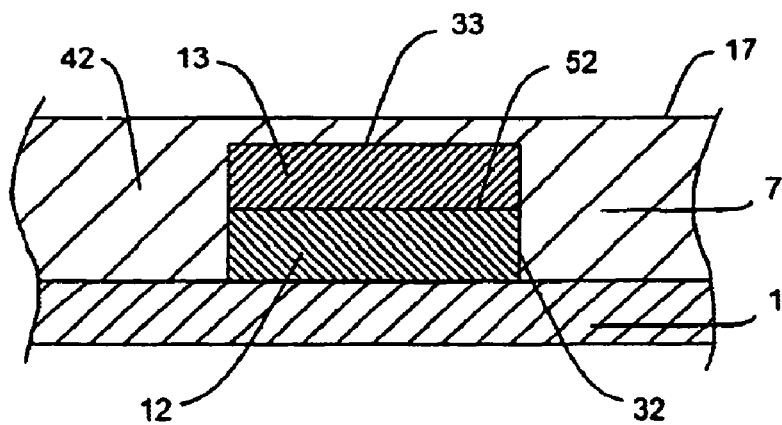
FIG. 13 is a cross-sectional view showing a passivation layer conforming to and covering a semiconductor device and a hard surface, in accordance with an embodiment of the method of the present invention.

FIG. 13 is a cross-sectional view showing a conforming passivation layer 7 applied to the substrate 1 of FIG. 5, in accordance with another embodiment of the present invention. The passivation layer 7 is applied to conform to and cover the semiconductor device 12. An applied passivation layer surface 17 extends to a predetermined elevation from the substrate 1 that is no less than the elevation of the device surface 52, in this embodiment, to an elevation above the hard mask 13. The passivation layer 5 conforms to the semiconductor device 12, the hard mask 13 and the substrate 1. The passivation layer 7 is preselected from materials with appropriate electrical properties and etching characteristics. A suitable material for the passivation layer 7 includes, but is not limited to, Bisbenzocyclotene (BCB) polymer. In one application technique, among others, the passivation material is spun onto the substrate 1, thus scaling and passivating the device side wall 32 of the semiconductor device 12.

Figure 14:
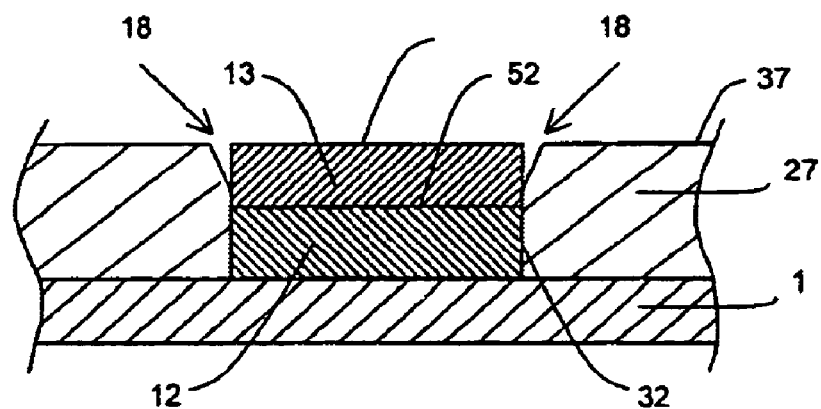
FIG. 14 is a cross-sectional view showing the passivation layer after an etching process surface, in accordance with an embodiment of the method of the present invention.

FIG. 14 is a cross-sectional view showing a passivation layer 25 after a suitable etching process of the passivation layer 25 of FIG. 13. The etching process produces a passivation layer surface 37 that is substantially the same elevation, from the substrate 1, as the hard mask surface 33. The hard mask 13 shields the semiconductor device 12 from exposure to the etching process. The thickness of the hard mask 13 provides tolerance to accommodate for some degree of trenching. A trench 18 extends from the passivation layer surface 37 to no deeper than the thickness of the hard mask 13, which prevents the device side wall 32 from exposure. Any micro-voids that may be present in the passivation layer 27 and adjacent to the device side wall 32 are not exposed to the etching process as the etching stops prior to reaching an elevation below the elevation of the device surface 52 so any defects such as voids at the elevation below the device surface 52 are prevented from etch exposure and therefore, the potential for etched void enlargement to expose the device side wall 32 is greatly reduced or eliminated. Further, the encased semiconductor device 12 is protected from exposure to the etching process reducing or preventing etch-induced damage. The hard mask 13 protects the device surface 52 from exposure to the passivation layer 15, and therefore, issues related to residual passivation material remaining on the device surface 52 is reduced or eliminated.

Figure 15:
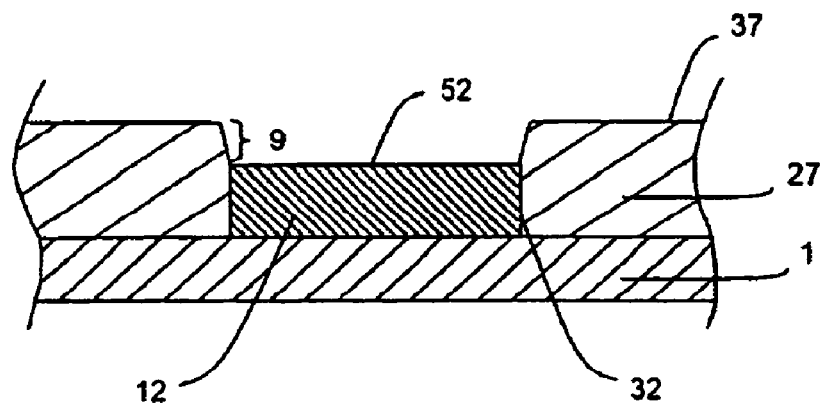
FIG. 15 is a cross-sectional view showing the passivation layer after the removal of the hard mask, in accordance with an embodiment of the method of the present invention.

FIG. 15 is a cross-sectional view after the removal of the hard mask 13 exposing the device surface 52. The hard mask 13 is removed in an etching process that does substantially detrimentally effect the passivation layer 37 nor the semiconductor device 12. The step 9 formed between the passivation layer surface 37 and the device surface 52 is controlled to be at or below an acceptable step height to allow for further processing, such as, the addition of metallization traces or interconnects. In this embodiment, the hard mask 13 had a maximum thickness defined by the maximum acceptable step height 9. For example, a step height of about 0.5 microns would be acceptable where interconnects are to be deposited onto the device surface 52 and the surrounding passivation layer 37. A larger step height 9 may be tolerated wherein a conformable interconnect material deposition process is used on the device surface.

Figure 16:
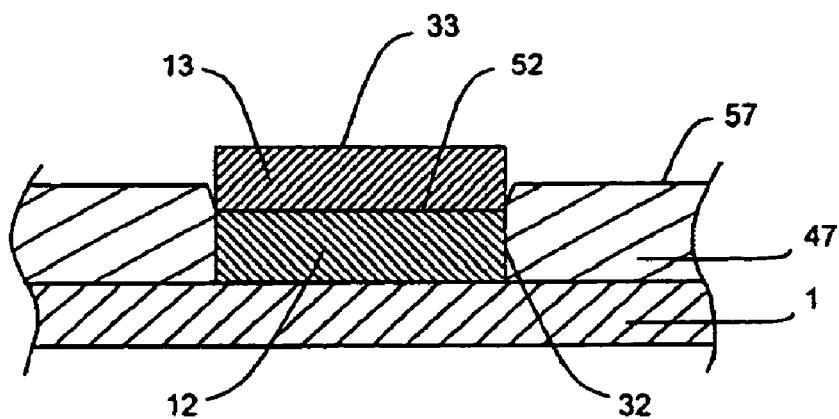
FIG. 16 is a cross-sectional view showing the passivation layer after an etching process, in accordance with an embodiment of the method of the present invention

FIG. 16 is a cross-sectional view showing a passivation layer 47 after a suitable etching process of the substrate 1 of FIG. 13, in accordance with another embodiment of the present invention. The etching process produces a passivation layer surface 57 that is between the elevation of the device surface 52 and the hard mask surface 33. The etching process is controlled so that there is sufficient passivation material above the elevation of the device surface 52 to accommodate for trenching.

Figure 17:
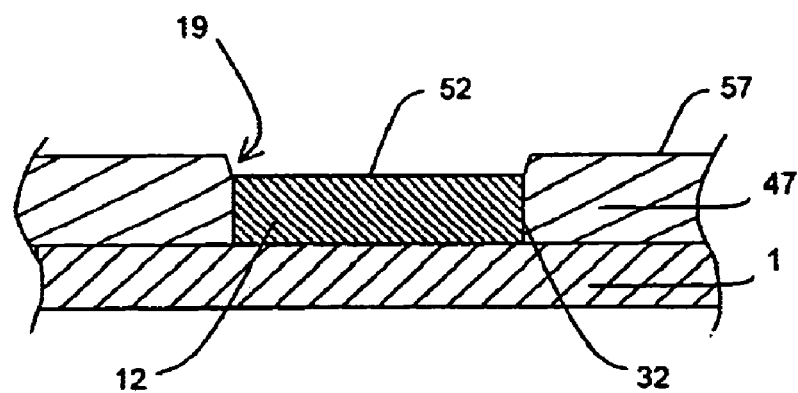
FIG. 17 is a cross-sectional view showing the passivation layer after the removal of the hard mask, in accordance with an embodiment of the method of the present invention.

FIG. 17 is a cross-sectional view after the removal of the hard mask 13 that exposes the device surface 52. As in the embodiment of FIG. 15, the step 19 formed between the passivation layer surface 57 and the device surface 52 is controlled to be at or below an acceptable step height. In this embodiment, the hard mask 13 may have a dimension above the device surface 52 that is larger than the acceptable step height since the passivation layer surface 27 is etched to below the hard mask surface 33.

Figure 18:
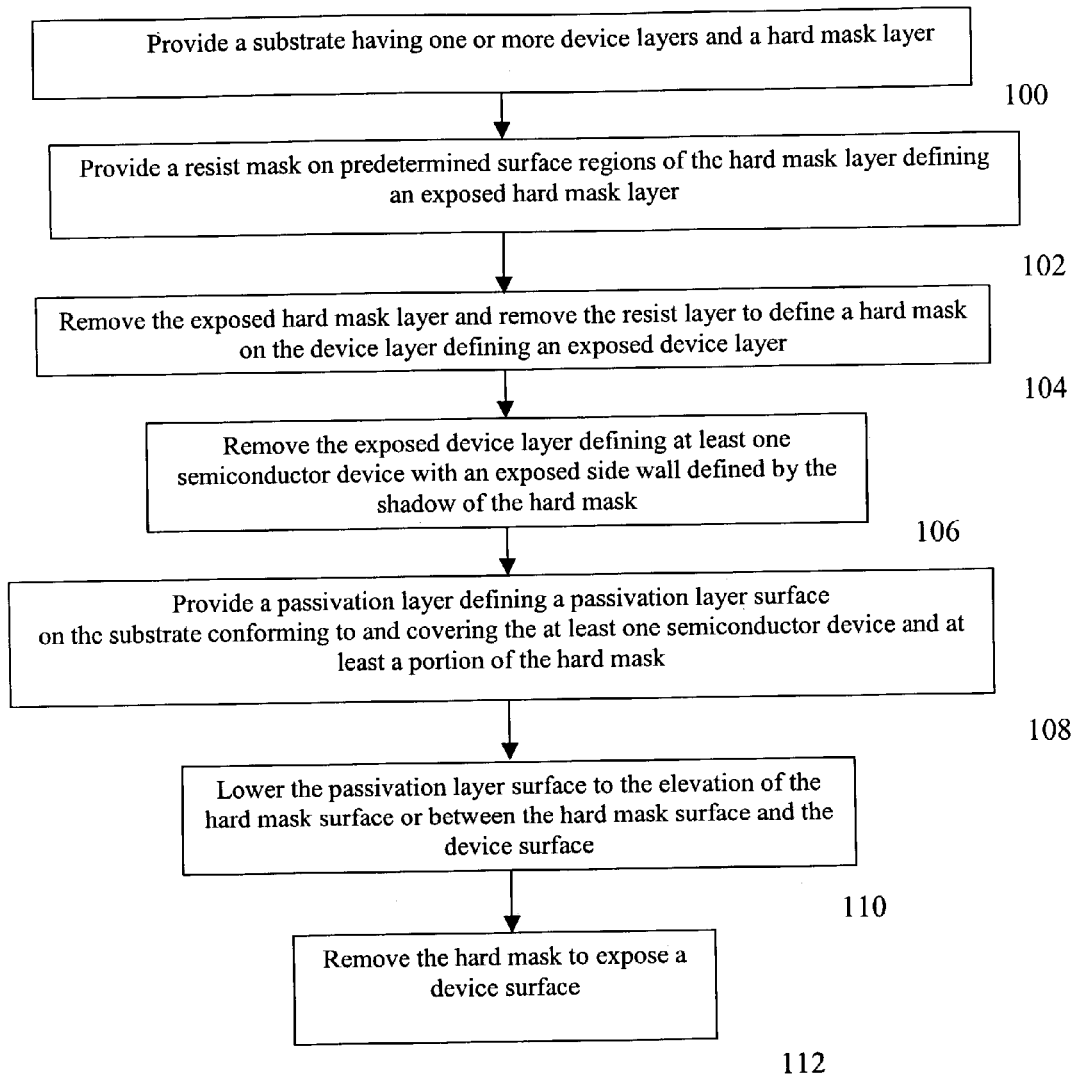
FIG. 18 is a flow chart of selected embodiments of methods in accordance with the present invention.

FIG. 18 is a flow diagram of a suitable exemplary method in accordance with various embodiments. One method in accordance with an embodiment of the invention comprises: providing a substrate having one or more device layers and a hard mask layer 100; providing a resist mask on predetermined surface regions of the hard mask layer defining an exposed hard mask layer 102; removing the exposed hard mask layer and removing the resist layer to define a hard mask on the device layer defining an exposed device layer 104; removing the exposed device layer using a suitable process, such as, but not limited to, a dry etching process, defining at least one semiconductor device with an exposed side wall defined by the shadow of the hard mask 106; providing a passivation layer defining a passivation layer surface on the substrate conforming to and covering the at least one semiconductor device and at least a portion of the respective hard mask 108; lowering the passivation layer surface using a suitable process, such as, but not limited to, etching, to the elevation of a hard mask surface or between the hard mask surface and a device surface 110; and removing the hard mask to expose the device surface 112.

Figure 19:
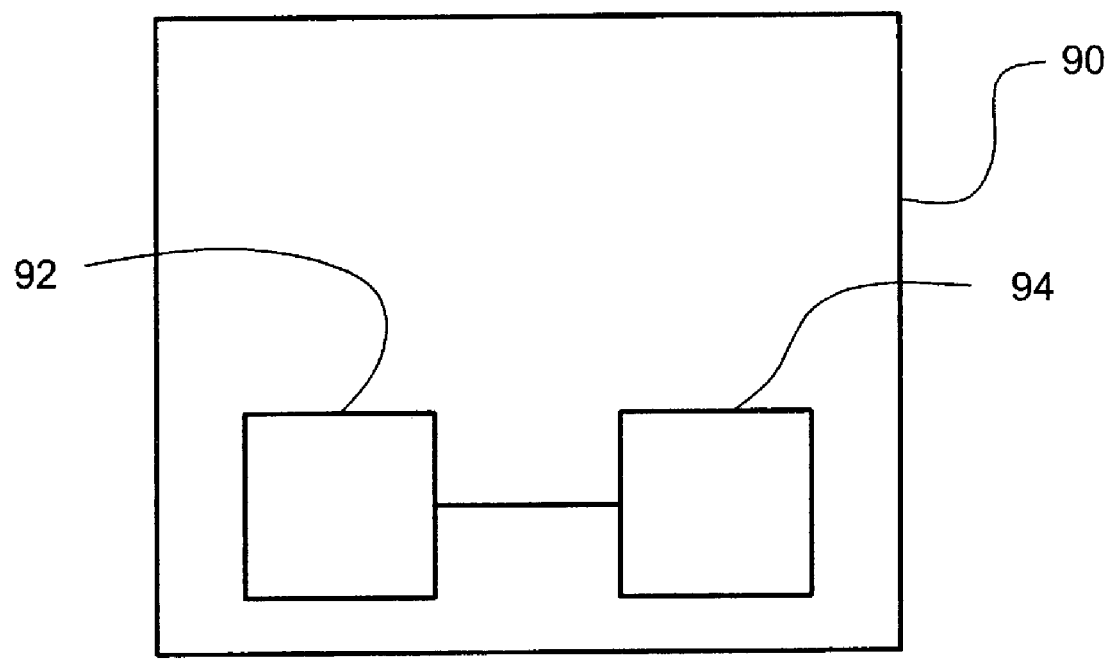
FIG. 19 is a representation of an electronic or optoelectronic assembly comprising a semiconductor device made in accordance with an embodiment of the method of the present invention.
Figure 20:
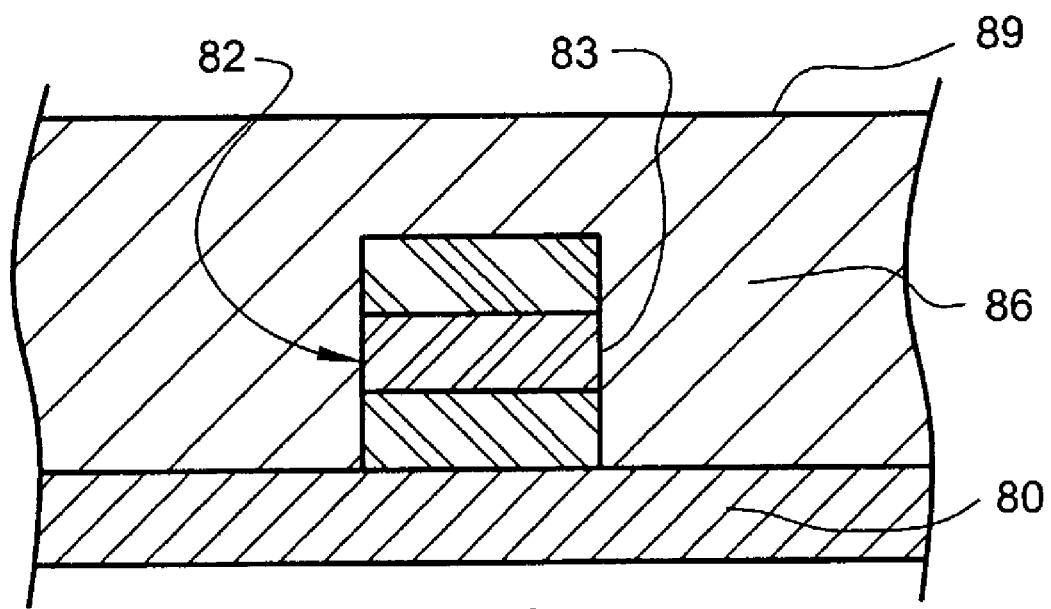
FIG. 20 is a cross-sectional view showing a passivation layer on a semiconductor device not covered by a hard mask.
Figure 21:
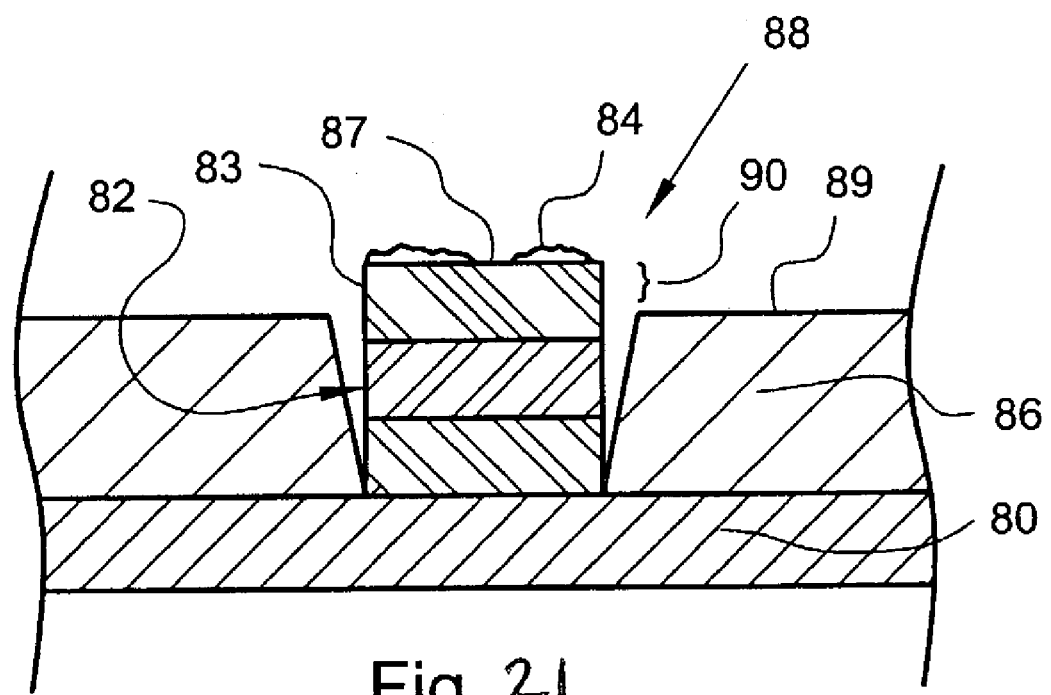
FIG. 21 is a cross-sectional view after etching the passivation layer.

FIG. 19 is a top view of an assembly 90 comprising a plurality of interconnected components 92, 94 wherein at least one component 92 comprises a semiconductor device fabricated in accordance with an embodiment of the methods of the present invention. The semiconductor device is tested, separated, packaged, incorporated into the component 92, and integrated into the assembly 90. Examples of assemblies 90 include, but not limited to, cell phones, networking systems, high brightness (HB) light emitting diodes (LEDs), laser diodes (LDs), photodiodes, modulator diodes, and multijunction solar cells.

Methods in accordance with the present invention can be used to fabricate many types of semiconductor devices, such as, but not limited to, heterobiopolar transistors (HBT) and high electron mobility transistors (HEMT) that are prevalent in cordless portable telephones, cell phones, as well as other communication devices.

Methods in accordance with the present invention can be used to fabricate semiconductor devices based on a variety of semiconducting materials suitable for many applications. For example, but not limited thereto, Indium Phosphide (InP)-based semiconductor devices are desirable for communication networks as InP devices have the ability to provide functional reliably and high speed operation useful for broadband fiberoptic and wireless components.

Gallium Nitride-based semiconductor devices are desirable for HB-LEDs and laser diodes in the blues spectrum, as well as memory devices due to GaN's ability to compactly store data and information. Gallium Arsenide Monolithic Microwave Integrated Circuit (GaAs MMIC)—based devices have the ability to deliver a wide range of wavelengths, such as those associated with television satellite transmissions transmitted anywhere on earth that has a satellite dish with MMIC devices.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method comprising:
   forming a hard mask disposed on and covering a portion of a device layer leaving at least another portion of the device layer uncovered by the hard mask;
   removing the uncovered portion of the device layer to define a device layer side wall substantially co-planar with a side wall of the hard mask;
   covering the device layer side wall and at least a portion of the hard mask with a passivation layer, the passivation layer having a top surface;
   lowering the top surface of the passivation layer to expose at least a portion of the hard mask; and
   removing the hard mask to define a step between the lowered top surface of the passivation layer and a top surface of the device layer.

2. The method of claim 1, wherein removing the uncovered portion of the device layer comprises removing the uncovered portion of the device layer using an etch process selected from a group consisting of a dry etch process and a wet etch process.

3. The method of claim 1, wherein lowering the top surface of the passivation layer comprises lowering the top surface of the passivation layer surface adjacent to the hard mask to an elevation between a top surface of the hard mask and the top surface of the device layer.

4. The method of claim 1, wherein lowering the top surface of the passivation layer comprises lowering the top surface of the passivation layer adjacent to the hard mask to an elevation substantially co-planar to a top surface of the hard mask.

5. The method of claim 1, wherein forming the hard mask layer on the device layer comprises disposing at least a material selected from the group consisting of silicon dioxide, silicon nitride, a semiconductor, and a metal on the device layer.

6. The method of claim 1 further comprising forming the device layer on a substrate.

7. The method of claim 6, wherein the device layer comprises a semiconductor layer.

8. The method of claim 6 further comprising forming the substrate.

9. The method of claim 6 further comprising forming a substrate from at least a material selected from the group consisting of silicon dioxide and silicon nitride.

10. The method of claim 1, wherein covering the device layer side wall and at least a portion of the hard mask with the passivation layer comprises:
covering the device layer side wall and at least a portion of the hard mask with a polymer layer, the polymer layer conforming to the device layer side wall.

11. A method comprising:
forming a hard mask disposed on and covering a portion of a semiconductor layer leaving at least another portion of the semiconductor layer uncovered by the hard mask;
removing the uncovered portion of the semiconductor layer to define a semiconductor device with an exposed side wall substantially coplanar with a side wall of the hard mask;
removing a portion of the semiconductor device side wall to expose a substrate disposed below the semiconductor device inside of a perimeter defined by the hard mask side wall to form a new semiconductor device side wall and to define a mask overhang extending over a portion of the substrate adjacent to the new semiconductor device side wall;
covering the new semiconductor device side wall and at least a portion of the hard mask with a passivation layer, the passivation layer having a top surface;
lowering the top surface of the passivation layer not covering by the hard mask to an elevation closer to the substrate than an elevation of a top surface of the hard mask to the substrate; and
removing the hard mask to expose a top surface of the semiconductor device and a co-planar passivation liner surface covering the new semiconductor side wall.

12. The method of claim 11, wherein removing the uncovered semiconductor layer comprises removing the uncovered semiconductor layer using an etch process selected from a group consisting of a dry etch process and a wet etch process.

13. The method of claim 11, wherein removing the portion of the uncovered device side wall comprises removing the portion of the uncovered device side wall using an etch process selected form a group consisting of a dry etch process and a wet etch process.

14. The method of claim 11, wherein lowering the top surface of the passivation layer comprises:
lowering the top surface of the passivation layer not covering the hard mask to an elevation closer to the substrate than the top surface of the semiconductor layer to the substrate.

15. The method of claim 14, wherein removing the hard mask comprises:
removing the hard mask to expose the top surface of the semiconductor device and the co-planar passivation liner surface, the top surface of the semiconductor device and the co-planar passivation liner surface covering the new semiconductor device side wall being at an elevation farther from the substrate than the lowered top surface of the passivation layer.

16. The method of claim 11, wherein lowering the top surface of the passivation layer comprises:
lowering the top surface of the passivation layer not covering the hard mask to an elevation closer to the substrate than the top surface of the hard mask to the substrate.

17. The method of claim 16, wherein removing the hard mask comprises:
removing the hard mask to expose the top surface of the semiconductor device and the co-planar passivation liner surface, the top surface of the semiconductor device and the co-planar passivation liner surface covering the new semiconductor device side wall being at an elevation closer to the substrate than the lowered top surface of the passivation layer to the substrate.

18. The method of claim 11, wherein more than one semiconductor device is defined and more than one corresponding co-planar passivation liner surface is exposed.

19. The method of claim 11 further comprising forming the substrate.

20. The method of claim 11 further comprising, forming the substrate from at least a material selected from the group consisting of silicon dioxide, and silicon nitride.

21. The method of claim 11, wherein forming the passivation layer on the substrate comprises forming a polymer layer on the substrate.

22. The method of claim 11 further comprising forming the semiconductor layer.

23. The method of claim 11, wherein forming the hard mask layer comprises disposing at least a material selected from the group consisting of silicon dioxide, silicon nitride, a semiconductor, and a metal on the semiconductor layer.

24. A method for fabricating an assembly comprising:
forming a semiconductor device, said semiconductor device formed at least in part by,
forming a hard mask disposed on and covering a portion of a semiconductor layer leaving at least another portion of the semiconductor layer uncovered by the hard mask,
removing the uncovered portion of the semiconductor layer to define a semiconductor device with an exposed side wall substantially coplanar with a side wall of the hard mask,
removing a portion of the semiconductor device side wall to expose a substrate disposed below the semiconductor device inside of a perimeter defined by the hard mask side wall to form a new semiconductor device side wall and to define a mask overhang extending over a portion of the substrate adjacent to the new semiconductor device side wall,
covering the new semiconductor device side wall and at least a portion of the hard mask with a passivation layer, the passivation layer having a top surface,
lowering the top surface of the passivation layer not covering the hard mask to an elevation closer to the substrate than an elevation of a top surface of the hard mask to the substrate, and
removing the hard mask exposing a top surface of the semiconductor device surface and a co-planar passivation liner surface covering the new semiconductor side wall; and
interconnecting a plurality of components wherein at least one component includes the semiconductor device.

25. The method of claim 24, wherein the semiconductor layer comprises more than one semiconductor layers with corresponding hard masks formed thereon.

26. The method of claim 24, wherein lowering the top surface of the passivation layer comprises:

lowering the top surface of the passivation layer not covering the hard mask to an elevation closer to the substrate than the top surface of the semiconductor layer to the substrate.

27. The method of claim 26, wherein removing the hard mask comprises:
removing the hard mask to expose the top surface of the semiconductor device and the co-planar passivation liner surface, the top surface of the semiconductor device and the co-planar passivation liner surface covering the new semiconductor device side wall being at an elevation farther from the substrate than the lowered top surface of the passivation layer.

28. The method of claim 24, wherein lowering the top surface of the passivation layer comprises:
lowering the top surface of the passivation layer not covering the hard mask to an elevation closer to the substrate than the top surface of the hard mask to the substrate.

29. The method of claim 28, wherein removing the hard mask comprises:
removing the hard mask to expose the top surface of the semiconductor device and the co-planar passivation liner surface, the top surface of the semiconductor device and the co-planar passivation liner surface covering the new semiconductor device side wall being at an elevation closer to the substrate than the lowered top surface of the passivation layer.

* * * * *

UNITED STATES PATENT AND TRADEMARK OFFICE
CERTIFICATE OF CORRECTION

PATENT NO. : 6,987,068 B2
APPLICATION NO. : 10/460878
DATED : January 17, 2006
INVENTOR(S) : Peter Friis et al.

It is certified that error appears in the above-identified patent and that said Letters Patent is hereby corrected as shown below:

Column 5
Line 27, "...cross-sectional – view..." should read --...cross-sectional view--.

Column 6
Line 21, "...the -semiconductor..." should read --...the semiconductor...--.

Column 7
Lines 16-17, "...hard mask surface 13..." should read --...hard mask surface 33...--.
Lines 31-32, "It is also be..." should read --It will also be...--.

Column 8
Line 61, "...passivation layer 37..." should read --...passivation layer surface 37...--.

Column 9
Line 4, "...passivation layer 37." should read --...passivation layer surface 37.--.
Line 23, "...passivation layer surface 27..." should read --...passivation layer surface 57...--.

Column 11
Line 33, "...covering by the..." should read --...covering the...--.
Line 48, "...selected form..." should read --...selected from...--.

Signed and Sealed this

Twenty-second Day of May, 2007

JON W. DUDAS
*Director of the United States Patent and Trademark Office*